(12) United States Patent
Fukutomi

(10) Patent No.: US 7,766,558 B2
(45) Date of Patent: Aug. 3, 2010

(54) OPTICAL TRANSCEIVER

(75) Inventor: Yasuhiro Fukutomi, Tokyo (JP)

(73) Assignee: NEC Corporation, Tokyo (JP)

( * ) Notice: Subject to any disclaimer, the term of this patent is extended or adjusted under 35 U.S.C. 154(b) by 57 days.

(21) Appl. No.: 12/329,924

(22) Filed: Dec. 8, 2008

(65) Prior Publication Data

US 2009/0148108 A1 Jun. 11, 2009

(30) Foreign Application Priority Data

Dec. 7, 2007 (JP) ............................. 2007-316649

(51) Int. Cl.
*G02B 6/36* (2006.01)
(52) U.S. Cl. ............................. 385/88; 385/14; 385/53
(58) Field of Classification Search .................. 385/14, 385/53, 88
See application file for complete search history.

(56) References Cited

U.S. PATENT DOCUMENTS

| | | | | |
|---|---|---|---|---|
| 7,533,254 B2 * | 5/2009 | Dybsetter et al. | ............... | 713/2 |
| 2005/0195865 A1 * | 9/2005 | Aronson | ..................... | 372/9 |

FOREIGN PATENT DOCUMENTS

| JP | 1996203629 A | 8/1996 |
|---|---|---|
| JP | 2006229067 A | 8/2006 |

* cited by examiner

*Primary Examiner*—Jennifer Doan

(57) ABSTRACT

In accordance with one aspect of the present invention, an optical transceiver includes a printed-circuit board, an optical module that converts a received optical signal into an electrical signal and converts an electrical signal into a optical signal, and transmits the converted signal, the optical module being mounted on the printed-circuit board, and an edge connector that inputs and outputs the electrical signal, the edge connector being mounted on the printed-circuit board. In the optical transceiver, at least an edge portion of the edge connector is formed in a direction roughly perpendicular to the optical signal transmitted/received at the optical module, and the printed-circuit board is removably connected to the host substrate through the edge connector in such a manner that the printed-circuit is roughly perpendicular to the host substrate to be connected.

10 Claims, 3 Drawing Sheets

OPTICAL TRANSCEIVER

INCORPORATION BY REFERENCE

This application is based upon and claims the benefit of priority from Japanese patent application No. 2007-316649, filed on Dec. 7, 2007, the disclosure of which is incorporated herein in its entirety by reference.

BACKGROUND ART

1. Technical Field

The present invention relates to an optical transceiver, in particular a structure to connect an optical transceiver to a host substrate.

2. Description of Related Art

Optical transceivers in which optical modules to reciprocally convert electrical signals and optical signals are packaged have been known. For optical transceivers, there are standards such as Small Form-factor Pluggable (SFP) transceivers and 10 Gbit/s small Form-factor Pluggable (XFP) transceivers. Such an optical transceiver is connected to a host substrate of an optical communication device (a switch, a router, and the like) through a connector mounted on that host substrate. As communication capacity has increased, it is necessary to implement a plurality of channels in a single host substrate in an optical communication device. Therefore, in an optical transceiver implementing channels, it has been desired to reduce the area on the host substrate where the optical transceiver is mounted.

Japanese Unexamined Patent Application Publication No. 2006-229067 discloses an optical transceiver including a connection terminal extending lengthwise and crosswise. With providing the connection terminal extending lengthwise and crosswise, it is possible to miniaturize the optical module in comparison to the case where all connection terminals are formed on one side of an optical module. In this way, it is possible to reduce the mounting area on the host substrate. Furthermore, Japanese Unexamined Patent Application Publication No. H08-203629 discloses, though it is not for optical transceivers, a structure to connect a printed-circuit board to a host substrate in such a manner that the printed-circuit board is perpendicular to the host substrate. By connecting the printed-circuit board perpendicularly to the host substrate, it is possible to reduce the mounting area for the printed-circuit board on the host substrate.

However, there is a problem in the optical transceiver described in Japanese Unexamined Patent Application Publication No. 2006-229067 that since the printed-circuit board on which the optical module is mounted is connected to the host substrate such that the printed-circuit board is horizontal with respect to the host substrate, the mounting area on the host substrate is large. Meanwhile, since the printed-circuit board is fixed to the host substrate with solder in the connection structure of the printed-circuit board described in Japanese Unexamined Patent Application Publication No. H08-203629, it is not suitable for the usage of optical transceivers. Because the optical transceivers are often removed and inserted again when a malfunction occurs in an optical communication device and a new application device is additionally mounted to the host substrate.

SUMMARY

In one aspect, the present invention has been made in view of these problems, and one of the objects of the present invention is to provide an optical transceiver capable of reducing the mounting area to the host substrate and being easily inserted into and removed from the host substrate.

In accordance with one aspect of the present invention, an optical transceiver includes: a printed-circuit board; an optical module that converts a received signal light into an electrical signal and converts an electrical signal into a signal light, and transmits the converted signal, the optical module being mounted on the printed-circuit board; and an edge connector that inputs and outputs the electrical signal, the edge connector being mounted on the printed-circuit board; wherein at least an edge portion of the edge connector is formed in a direction roughly perpendicular to the signal light transmitted/received at the optical module; and the printed-circuit board is removably connected to the host substrate through the edge connector in such a manner that the printed-circuit is roughly perpendicular to the host substrate to be connected.

Furthermore, in accordance with another aspect of the present invention, a host substrate includes an edge connector socket in which the above-mentioned optical transceiver is removably engaged, wherein a terminal of the edge connector socket is formed in a direction roughly perpendicular to the host substrate.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

The above and other objects, advantages and features of the present invention will be more apparent from the following description of certain exemplary embodiments taken in conjunction with the accompanying drawings, in which.

EXEMPLARY EMBODIMENT

An optical transceiver in accordance with one aspect of the present invention is explained hereinafter with reference to the drawings.

First Exemplary Embodiment

Figure 1:
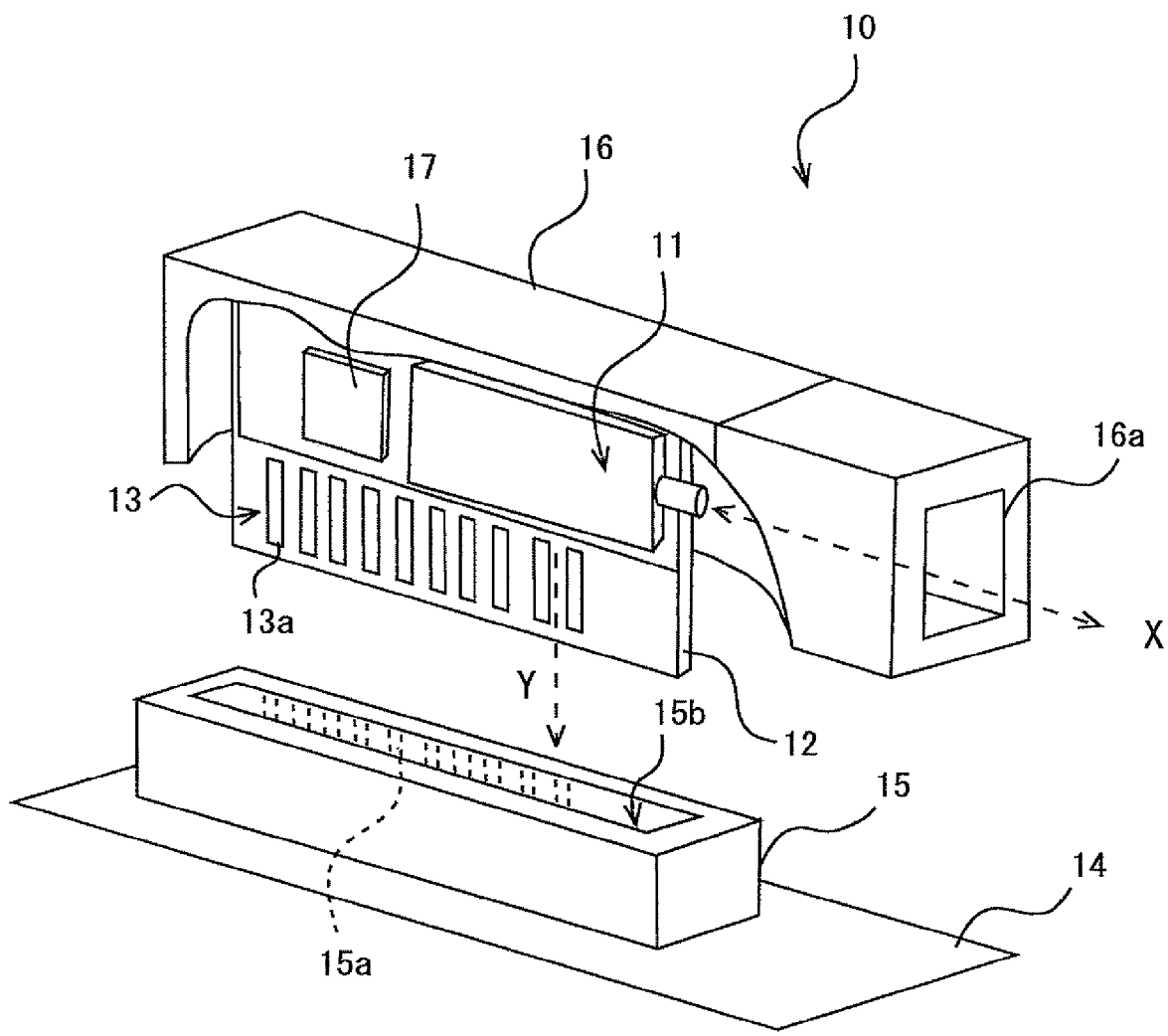
FIG. 1 shows an example of the overall structure of an optical transceiver in accordance with a first embodiment of the present invention.

FIG. 1 shows an example of the overall structure of an optical transceiver 10. The optical transceiver 10 reciprocally converts an electrical signal and an optical signal. The optical transceiver 10 converts an optical signal received through an optical fiber into an electrical signal and externally outputs the electrical signal, and converts an externally input electrical signal into an optical signal and sends the optical signal through an optical fiber. The optical transceiver 10 is connected, for example, to a host substrate 14 such as a mother board of a personal computer.

As shown in FIG. 1, the optical transceiver 10 includes a printed-circuit board 12 and a case 16. A part of the case 16 is removed in FIG. 1 for the illustrative purpose. The case 16 has a rectangular box shape. The case 16 has an opening portion 16a formed therein. An optical fiber (not shown), which is used as a transmission path for an optical signal, is connected through this opening portion 16a. That is, the opening portion 16a serves as an optical connector to which an optical fiber is connected. Furthermore, the case 16 has another opening portion formed on the surface that is opposed to the host substrate 14 (i.e., bottom side in the figure).

Figure 2:
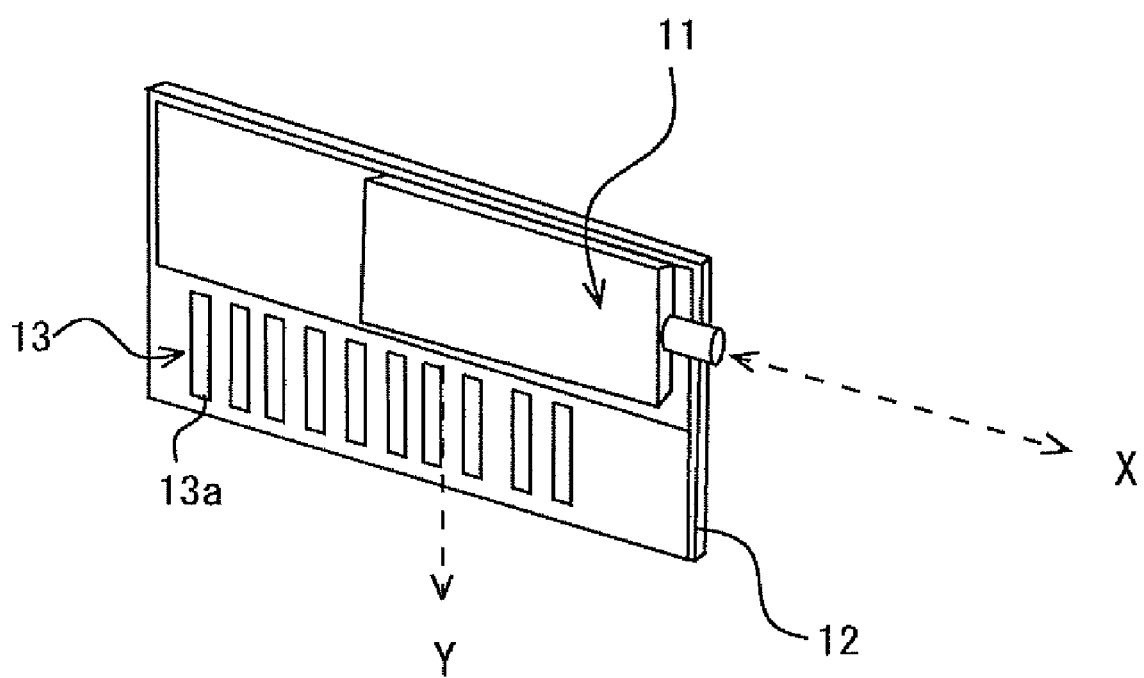
FIG. 2 shows an example of the structure of apart of an optical transceiver in accordance with a first embodiment of the present invention.

The case 16 accommodates a printed-circuit board 12 shown in FIG. 2 within it. The printed-circuit board 12 is, for example, a rigid substrate. An optical module 11, an edge connector 13, and an IC (Integrated Circuit) 17 are mounted on the printed-circuit board 12.

The optical module 11 includes a receiving element (not shown) to convert a signal light into an electrical signal, and a transmitting element (not shown) to convert an electrical signal into a signal light. The edge connector 13 is formed in the edge portion of the printed-circuit board 12. The edge connector 13 is a planar-shaped terminal, and formed in the printed-circuit board 12 in such a manner that it becomes parallel to the printed-circuit board 12. The edge connector 13 is exposed on the front surface of the printed-circuit board 12. Alternatively, the edge connector 13 may be formed on the back surface of the printed-circuit board 12, or on both surfaces of the printed-circuit board 12. The edge connector 13 is formed in a direction (Y-direction) roughly perpendicular to the optical axis of a signal light transmitted/received at the optical module 11. That is, the edge connector 13 is formed so as to be roughly perpendicular to the optical axis of the signal light. Note that the only requirement for the edge connector 13 is that at least the edge portion 13a that is electrically connected to the outside should be formed in the direction roughly perpendicular to the signal light. Therefore, the portions other than the edge portion of the host substrate 14 are not necessarily formed in the Y-direction.

An optical signal received through the optical fiber is converted into an electrical signal by the receiving element of the optical module 11, and output through the edge connector 13 to an electronic component mounted on the host substrate 14. Furthermore, an electrical signal input from the host substrate 14 through the edge connector 13 is converted into an optical signal by the transmitting element of the optical module 11, and sent to the outside through the optical fiber connected to the opening portion 16a. The optical transceiver 10 is connected to the host substrate 14 on the side that extends in a direction (Y-direction) perpendicular to the optical axis direction (X-direction) of the signal light. The edge connector 13 is configured such that it protrudes from the bottom of the case 16 to the host substrate 14 side.

As shown in FIG. 1, the optical transceiver 10 is the connected to the host substrate 14 in the edge connector 13 protruding to the host substrate 14 side. The host substrate 14 is formed, for example, from a rigid substrate. The host substrate 14 is equipped with an edge connector socket 15 that engages with the edge connector 13. The edge connector socket 15 is formed in a frame shape, and the edge connector 13 of the optical transceiver 10 is inserted into the slot portion 15b located at the center. Pins 15a, which are electrically connected to the edge connector 13, are formed on the inside of the slot portion 15b. The pins 15a are provided for their respective terminals of the edge connector 13. Note that when the edge connector 13 is formed on both sides of the printed-circuit board 12, the pins 15a are also formed on both inner sides of the slot portion 15b.

The optical transceiver 10 is connected to the host substrate 14 in such a manner that the printed-circuit board 12 and the host substrate 14 are roughly perpendicular to each other.

That is, the printed-circuit board 12 is connected to the host substrate 14 in a state where the printed-circuit board 12 is perpendicular to the host substrate 14. When the edge connector 13 is inserted into the slot portion 15b, the edge connector socket 15 securely holds the edge connector 13 by sandwiching it from the both sides. In a state where the optical transceiver 10 is connected to the host substrate 14 in such a manner, an optical signal received by the optical module 11 is converted into an electrical signal and output to a component mounted on the host substrate 14 through the edge connector 13 and the edge connector socket 15. This component is such as a processor and a memory or the like. Furthermore, an electrical signal generated by a processor or the like is input to the optical module 11 through the edge connector 13 and the edge connector socket 15, converted into an optical signal, and output to the outside through the optical fiber.

Furthermore, the printed-circuit board 12 also includes an IC 17 mounted thereon. The IC 17 is, for example, a laser driver IC, a limiting amplifier IC, or the like. Note that explanation of the other electronic components mounted on the printed-circuit board 12 is omitted.

Next, the advantageous effects of the optical transceiver 10 having such a structure are explained hereinafter. A waveguide (not shown) extending in a direction roughly parallel to the transmitted/received signal light is formed in the optical module 11 mounted on the optical transceiver 10, and therefore the optical module 11 might have a longish shape in the optical axis direction (X-direction) of the signal light. Furthermore, as the shape of the optical module 11 becomes longer, the printed-circuit board 12 on which the optical transceiver 10 is mounted has also a longish shape in the optical axis direction of the signal light. Meanwhile, as the apparatuses have become more sophisticated in recent years, the numbers of terminals of edge connectors 13 have been also on the rise. Therefore, if the edge connector 13 is arranged in the short side direction (Y-direction) of the printed-circuit board 12, it is necessary to secure sufficient number of printed-circuit boards 12 to accommodate the increased number of terminals 12 of the edge connector 13. By contrast, since the edge connector 13 is formed in a position perpendicular to the transmitted/received signal light at the optical transceiver 10 in accordance with an exemplary embodiment of the present invention, the edge connector 13 can be formed on the long side in the optical axis direction (X-direction) so that the shape of the printed-circuit board 12 can be effectively utilized.

Furthermore, the printed-circuit board 12 is connected to the edge connector socket 15 in such a manner that the printed-circuit board 12 is perpendicular to the host substrate 14 in the optical transceiver 10 in accordance with an exemplary embodiment of the present invention. Therefore, it is possible to reduce the mounting area for the optical transceiver 10 on the host substrate 14 in comparison to the case where a printed-circuit board 12 is connected to a host substrate 14 in such a manner that the printed-circuit board 12 is parallel to the host substrate 14.

Furthermore, since the edge connector 13 is formed in the optical transceiver 10 and engaged in the edge connector socket 15 formed on the host substrate 14 in the optical transceiver 10 in accordance with an exemplary embodiment of the present invention, there is no need to secure the optical transceiver 10 to the host substrate 14 by using solder. Furthermore, by using the edge connector 13, the optical transceiver 10 can be easily inserted into and removed from the host substrate 14, and therefore it is easy to perform a task such as replacement of the optical transceiver in the event of a malfunction or replacement with a functionally-enhanced optical transceiver.

As described above, in accordance with the optical transceiver 10 in accordance with an exemplary embodiment of the present invention, it is possible to provide a structure that enables the reduction of the mounting area for the optical transceiver 10 and the insertion and the removal of the optical transceiver 10 into and from the host substrate 14 with ease.

Second Exemplary Embodiment

Figure 3:
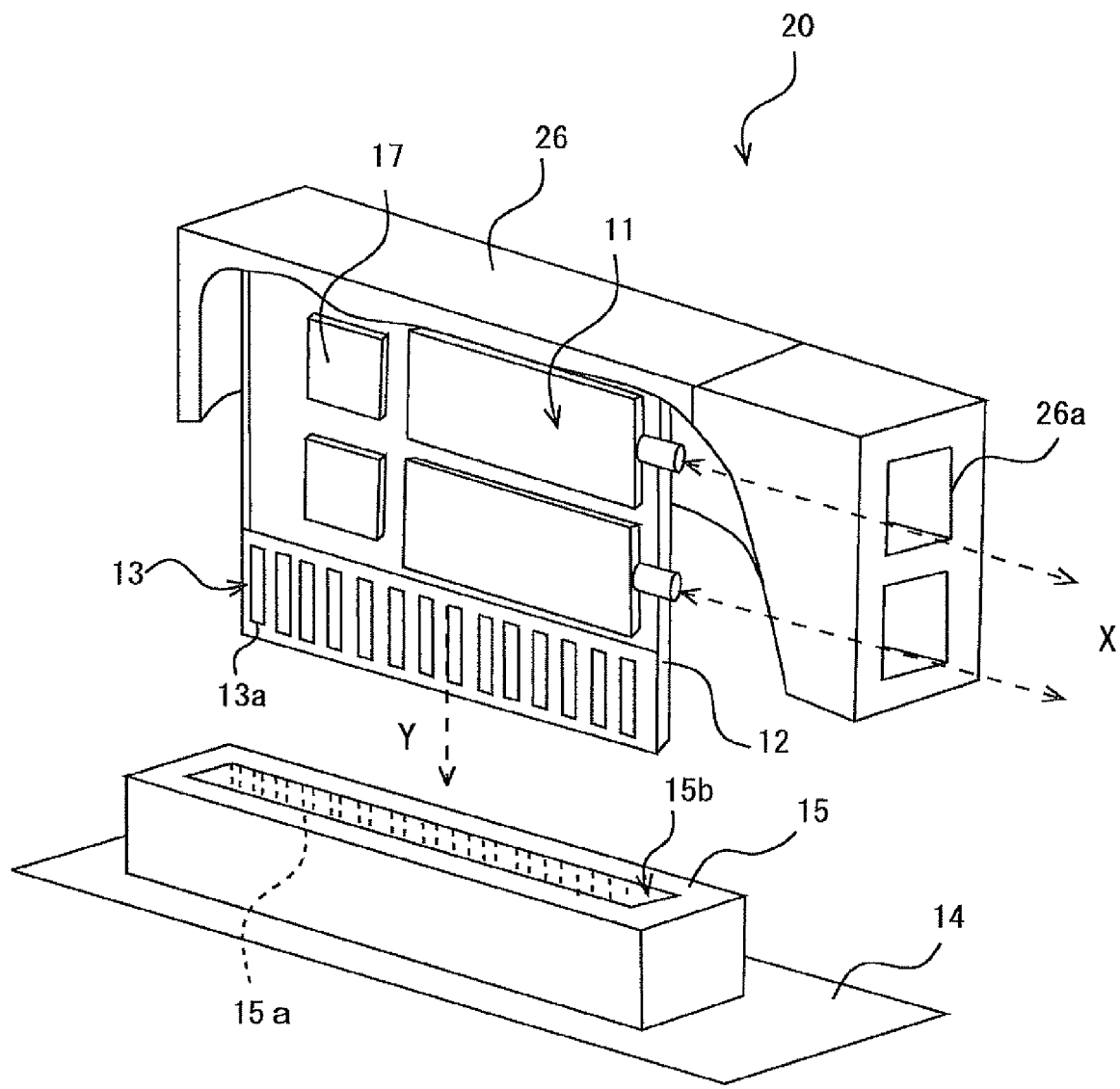
FIG. 3 shows an example of the overall structure of an optical transceiver in accordance with a second embodiment of the present invention.

FIG. 3 shows an example of a structure of an optical transceiver in accordance with a second exemplary embodiment of the present invention. This exemplary embodiment is characterized in that two optical modules 11 are mounted in a single optical transceiver 20. That is, the optical transceiver in accordance with this exemplary embodiment has two optical channels. Note that the same signs are assigned to components having substantially the same structures, and explanation of them is omitted.

As shown in FIG. 3, a rectangular case 26 has two opening portions 26a formed in a row in the Y-direction. These opening portions 26a serve as optical connectors to which optical fibers are externally connected. An optical fiber (not shown) is connected to each of the opening portions 26a. The case 26 accommodates a printed-circuit board 12 within it. Two optical modules 11 are mounted on the printed-circuit board 12. The optical modules 11 are arranged in positions corresponding to their respective opening portions 26a. Furthermore, ICs 17 corresponding to their respective optical modules 11 are also provided on the printed-circuit board 12. The edge connector 13 is formed in the edge portion of the printed-circuit board 12 such that the edge connector 13 is exposed on the surface of the printed-circuit board 12. The edge connector 13 is provided for each of the two optical modules 11. Note that a terminal to supply a power supply voltage or a similar terminal may be shared between two optical modules.

Similarly to the previous exemplary embodiment, the edge connector 13 is formed in a direction (Y-direction) perpendicular to the optical axis (X-direction) of the signal light transmitted/received at the optical module 11. The edge connector 13 is configured such that it protrudes from an opening portion (not shown) formed in the case 26 to the host substrate 14 side. The edge connector 13 is engaged in the edge connector socket 15 formed on the host substrate 14 in such a manner that the printed-circuit board 12 is perpendicular to the host substrate 14.

In such a case where a plurality of optical modules 11 are mounted in a single optical transceiver 20, the number of terminals of the edge connector 13 that is provided for the optical modules 11 is increased (i.e., doubled, tripled, . . . ). However, since the edge connector 13 is formed in the long side direction (X-direction) of the printed-circuit board 12, the shape of the printed-circuit board 12 can be effectively utilized. Therefore, even when the number of the terminals is increased, the number of the terminals of the edge connector can be increased without changing the width in the Y-direction of the optical transceiver 20. Note that although an example where two optical modules 11 are mounted is explained in this exemplary embodiment, any given number of optical modules 11 may be mounted in a single optical transceiver 20.

The present invention is not limited to the above-described exemplary embodiments, and various modifications can be made without departing from the spirit of the present invention.

In accordance with one aspect of an optical transceiver in accordance with the present invention, it is possible to reduce the mounting area for the optical transceiver and to easily insert and remove it into and from the host substrate.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. An optical transceiver comprising:
a printed-circuit board;
an optical module that converts a received optical signal into an electrical signal and converts an electrical signal into an optical signal, and transmits the converted signal, the optical module being mounted on the printed-circuit board; and
an edge connector that inputs and outputs the electrical signal, the edge connector being mounted on the printed-circuit board;
wherein at least an edge portion of the edge connector is formed in a direction roughly perpendicular to the optical signal transmitted/received at the optical module; and
the printed-circuit board is removably connected to the host substrate through the edge connector in such a manner that the printed-circuit is roughly perpendicular to the host substrate to be connected.

2. The optical transceiver according to claim 1, wherein:
more than one optical modules are mounted on the printed-circuit board; and
the edge connector is provided for each of the optical modules.

3. The optical transceiver according to claim 1, wherein a waveguide extending roughly parallel to the transmitted/received signal light is formed in the optical module.

4. The optical transceiver according to claim 1, wherein an IC is mounted on the printed-circuit board.

5. The optical transceiver according to claim 4, wherein the IC is a laser driver IC or a limiting amplifier IC.

6. The optical transceiver according to claim 1, further comprising a case that accommodates the printed-circuit board.

7. The optical transceiver according to claim 6, wherein a first opening portion is formed in the case to protrude the edge connector therethrough to the host substrate side.

8. The optical transceiver according to claim 6, wherein a second opening portion is formed in the case to connect an optical fiber therethrough.

9. A host substrate comprising an edge connector socket, the optical transceiver according to claim 1 being removably engaged in the edge connector socket,
wherein a terminal of the edge connector socket is formed in a direction roughly perpendicular to the host substrate.

10. The host substrate according to claim 9, wherein the terminal is connected to the edge connector by engaging the terminal with the edge connector in such a manner that the edge connector is sandwiched by the terminal on the both sides.

* * * * *